United States Patent [19]
Sano et al.

[11] Patent Number: 5,119,267
[45] Date of Patent: Jun. 2, 1992

[54] CAPACITOR FOR AN INTEGRATED CIRCUIT

[75] Inventors: Yoshiki Sano, Kashihara; Yoshinori Ogawa, Kita-Katsuragi, both of Japan

[73] Assignee: Sharp Kabushiki Kaisha, Japan

[21] Appl. No.: 571,864

[22] Filed: Aug. 24, 1990

[30] Foreign Application Priority Data

Aug. 31, 1989 [JP] Japan .................. 1-226459

[51] Int. Cl.⁵ .................. H01G 4/06; H01L 27/02
[52] U.S. Cl. .................. 361/311; 357/51
[58] Field of Search .......... 361/311, 312, 313, 320, 361/321; 357/51

[56] References Cited

U.S. PATENT DOCUMENTS 3,496,435  2/1970  Manley .................. 361/320
4,914,546  4/1990  Alter .

FOREIGN PATENT DOCUMENTS 257553  12/1985  Japan .................. 357/51

OTHER PUBLICATIONS

Patent Abstracts of Japan, vol. 7, No. 186 (E-193)(1331) 16 Aug. 1983, & JP-A-58 90755 (Nippon Denki) 30 May 1983.
Patent Abstracts of Japan, vol. 6, No. 16 (E-92)(894) 29 Jan. 1982, & JP-A-56 138946 (Tokyo Shibaura Denki) 29 Oct. 1981.

*Primary Examiner*—Donald Griffin
*Attorney, Agent, or Firm*—Nixon & Vanderhye

[57] ABSTRACT

A capacitor having a semiconductor substrate with a diffusion layer disposed in a portion of the semiconductor substrate and a first insulation layer disposed on the semiconductor substrate and the diffusion layer, the capacitor capable of providing a capacitance stably for an integrated circuit includes a first metallic layer disposed on the diffusion layer for conducting an electric current therethrough with the first insulation layer between the semiconductor substrate, a second insulation layer disposed on the first metallic layer for insulating the first metallic layer, and a second metallic layer disposed on the second insulation layer for conducting an electric current therethrough, the capacitance being expressed by C with a relation of $C = C_M + C_B$, the $C_M$ representing a capacitance occurred between the first metallic layer and the second metallic layer, the $C_B$ representing a capacitance occurred between the first metallic layer and the semiconductor substrate, respectively. The capacitor includes a third metallic layer which is disposed on the diffusion layer for conducting an electric current therethrough, and a third insulation layer which is disposed on the second metallic layer for protecting the integrated circuit. The capacitor also includes a mold resin which is disposed on the third insulation layer for sealing the capacitor.

5 Claims, 2 Drawing Sheets

CAPACITOR FOR AN INTEGRATED CIRCUIT

BACKGROUND OF THE INVENTION

1. Field of the Invention

The present invention relates to a capacitor for an integrated circuit.

2. Description of the Related Art

The inventors of the present invention know that a capacitor which is used for an analog signal circuit is produced by using an integrated circuit technology and formed with several different layers as shown in FIG. 1.

In FIG. 1, the capacitor has a semiconductor substrate 11, a diffusion layer 12, an insulation layer 13, a metallic layer 14, another insulation layer 15, a mold resin layer 16, and another metallic layer 17.

The diffusion layer 12 is so disposed that the diffusion layer 12 is penetrated in an upper portion of the semiconductor 11 with a certain depth.

The insulation layer 13 is disposed on an upper surface of the semiconductor substrate 11 as well as an upper surface of the diffusion layer 12.

The metallic layer 14 is disposed between the insulation layer 13 and the insulation layer 15 so that the metallic layer 14 is isolated from the semiconductor substrate 11 electrically.

The insulation layer 15 is disposed on the metallic layer 14 as well as the metallic layer 17 for protecting chips, and the chips are protected by the mold resin 16 which is formed on the insulation layer 15.

A capacitance $C_T$ of the above-mentioned is represented by a sum of two capacitances, one of which is a capacitance $C_A$ existed between the diffusion layer 12 and the metallic layer 14, the other one of which is so-called a floating capacitance $C_S$ existing between the metallic layer 14 and the mold resin 16. In brief, the capacitance is expressed by a relation $C_T = C_A + C_S$.

Since the value of the floating capacitance $C_S$ varies due to foreign matter on a surface of the semiconductor substrate 11 or the elements of the mold resin 16, the value of the capacitance $C_T$ is also varies.

In case the above-mentioned capacitor is used for an analog signal storage circuit, the metallic layer 14 is connected with an analog switch and the diffusion layer 12 is grounded through the metallic layer 17.

However, a stable potential can not be produced by the above-mentioned capacitor with respect to a fixed input signal because that the value of the capacitance $C_T$ varies as described above, thereby the analog signals are not stored stably in the analog signal storage circuit.

SUMMARY OF THE INVENTION

It is an object of the present invention to provide a capacitor capable of providing a stable capacitance for an integrated circuit.

The object of the present invention can be achieved by a capacitor having a semiconductor substrate with a diffusion layer disposed in a portion of the semiconductor substrate and a first insulation layer disposed on the semiconductor substrate and the diffusion layer, the capacitor being capable of providing a capacitance stably for an integrated circuit includes a first metallic layer disposed on the diffusion layer with the first insulation layer for conducting an electric current therethrough, a second insulation layer disposed on the first metallic layer for insulating the first metallic layer, and a second metallic layer disposed on the second insulation layer for conducting an electric current therethrough, the capacitance being expressed by C with a relation of $C = C_M + C_B$, $C_M$ representing the capacitance between the first metallic layer and the second metallic layer, $C_B$ representing a capacitance occurred between the first metallic layer and the semiconductor substrate, respectively.

Preferably, the capacitor includes a third metallic layer which is disposed on the diffusion layer for conducting an electric current therethrough.

Moreover, the capacitor preferably includes a third insulation layer which is disposed on the second metallic layer for protecting the integrated circuit.

Furthermore, the capacitor preferably includes a mold resin which is disposed on the third insulation layer for sealing the capacitor.

Preferably, the capacitor is used for an analog signal storage circuit.

Furthermore, the capacitor is preferably used for storing an analog signal.

The analog signal is a video signal, preferably.

A capacitance occurs between a first metallic layer and a semiconductor substrate, as well as between the first metallic layer and a second metallic layer. However, this capacitance will scarcely be affected by foreign matter on the surface of the semiconductor substrate or the elements of the mold resin.

According to the present invention, a capacitor capable of providing a capacitance stably for integrated circuits, which will scarcely be affected by foreign matter on the surface of the semiconductor substrate or the elements of the mold resin, is provided. The use of the capacitor of the present invention enables the performance and characteristics of a circuit using analog signals for analog signal storage circuits to be improved greatly.

These and other objects, features and advantages of the present invention will become clear when reference is made to the following description of the preferred embodiments of the present invention, together with reference to the accompanying drawings.

DESCRIPTION OF THE PREFERRED EMBODIMENTS

One embodiment of a capacitor for an integrated circuit of the present invention will be explained in details with reference to the accompanying drawings.

Figure 1:
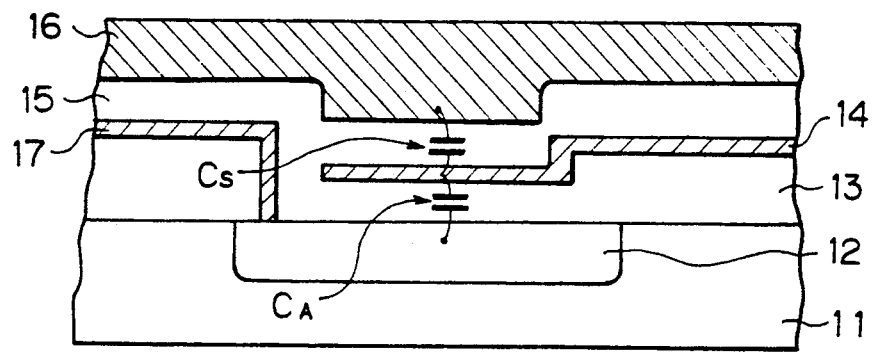
FIG. 1 shows a schematic cross sectional view of a known capacitor used for integrated circuits.
Figure 2:
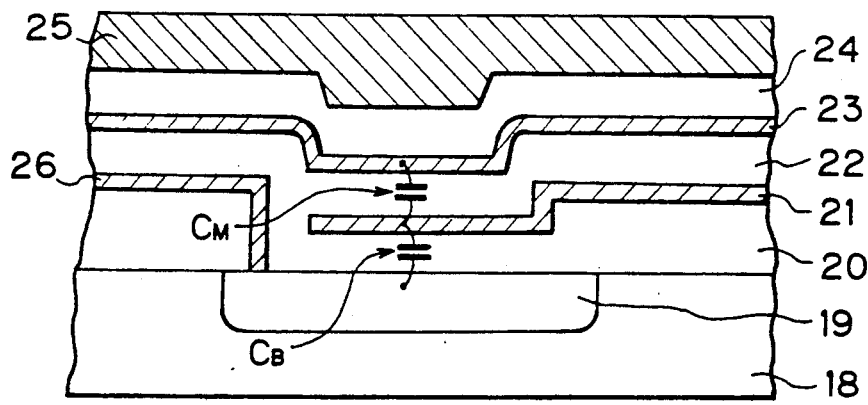
FIG. 2 shows a schematic cross sectional view of one embodiment of a capacitor for integrated circuits of the present invention.

FIG. 2 shows the compositions of the capacitor of the embodiment schematically.

As shown in FIG. 2, the capacitor includes a semiconductor substrate 18, a diffusion layer 19, a first insulation layer 20, a first metallic layer 21, a second insulation layer 22, a second metallic layer 23, a third insulation layer 24, a mold resin 25, and a third metallic layer 26.

The diffusion layer 19 is so formed that the diffusion layer 19 penetrates in an upper portion of the semiconductor substrate 18 with a certain depth.

The first insulation layer 20 is disposed on an upper surface of the semiconductor substrate 18 as well as an upper surface of the diffusion layer 19.

The first metallic layer 21 for conducting an electric current (i.e., an input signal) is disposed between the first insulation layer 20 and the second insulation layer 22.

The second metallic layer 23 is disposed between the second insulation layer 22 and the third insulation layer 24, and the third metallic layer 26 is formed in a position isolated from both the first metallic layer 21 and the second metallic layer 23

The second insulation layer 22 is so arranged that the first metallic layer 21 do not conduct with the second metallic layer 23.

The third insulation layer 24 is formed on the second metallic layer 23, and the mold resin 25 is formed on the third insulation layer 24 for protecting the chips.

The capacitor shown in FIG. 2 has a capacitance C which is expressed by a relation of $$C = C_B + C_m \qquad (1)$$

with $C_B$ representing a capacitance occurred between the semiconductor substrate 18 and the first metallic layer 21, and $C_M$ representing a capacitance occurred between the first metallic layer 21 and the second metallic layer 23.

The value of the capacitance $C_M$ is a stable capacitance and is not affected by foreign matters on the surface of the semiconductor substrate 18 or the elements of the mold resin, thereby the capacitor is stable and capable of providing a capacitance C stably, as a result a stable output is supplied by the capacitor.

Figure 3:
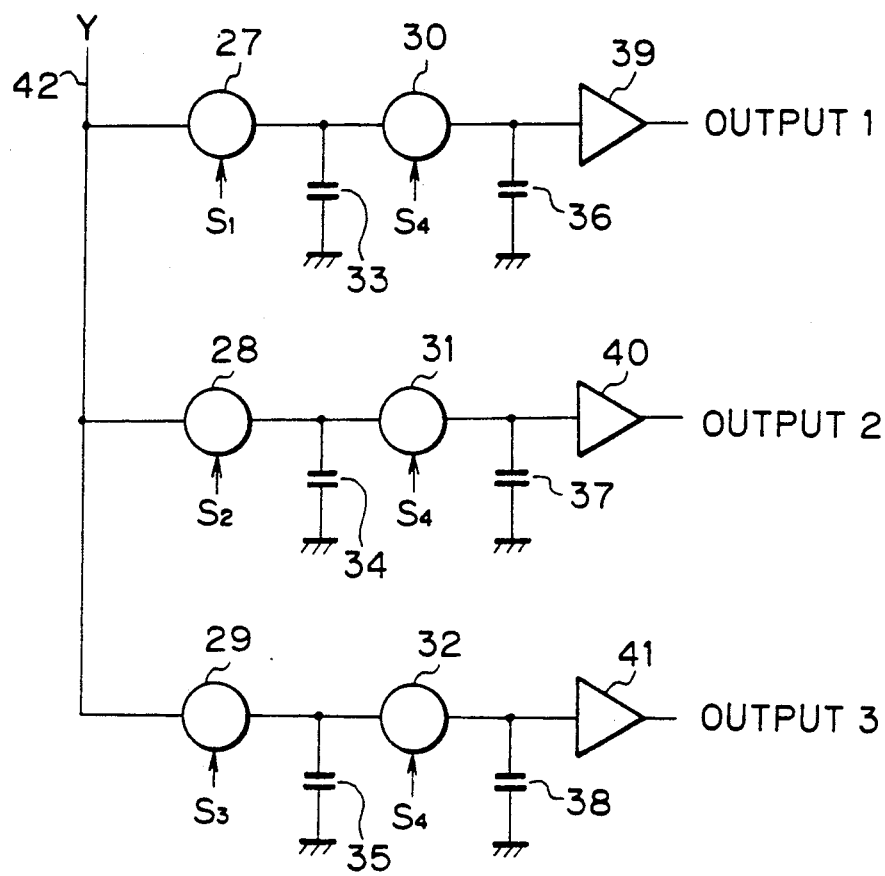
FIG. 3 illustrates an arrangement of an analog signal storage circuit in which the capacitor shown in FIG. 2 is used.

FIG. 3 shows an example of the arrangement of an analog signal storage circuit in which the capacitor shown in FIG. 2 is used. Such an analog signal storage circuit is used, for example, for a driving circuit of a liquid-crystal display device.

Three analog switches 27 to 29 are connected to a signal input line 42. One of the terminals of the capacitor 33 and the analog switch 30 are both connected to the output side of the analog switch 27.

Likewise, one of the terminals of the capacitor 34 and the analog switch 31 are both connected to the output side of the analog switch 28, and one of the terminals of the capacitor 35 and the analog switch 32 are both connected to the output side of the analog switch 29, respectively. The other terminals of the capacitors 33 to 35 are grounded respectively.

One of the terminals of the capacitor 36 and the buffer 39 are both connected to the output side of the analog switch 30.

Likewise, one of the terminals of the capacitor 37 and the buffer 40 are both connected to the output side of the analog switch 31, and one of the terminals of the capacitor 38 and the buffer 41 are both connected to the output side of the analog switch 32 respectively. The other terminals of the capacitors 36 to 38 are grounded respectively.

Analog switches 27 to 29 are respectively controlled by analog switch control signals $S_1$ to $S_3$. Analog switches 27 to 29 are turned on at a time when a corresponding analog switch control signal is turned to a high level, and turned off at a time when the corresponding analog switch control signal is turned to a low level. Analog switches 30 to 32 are turned on at a time when an analog switch control signal $S_4$ is turned to a high level, and turned off at a time when the analog switch control signal $S_4$ is turned to a low level.

Figure 4:
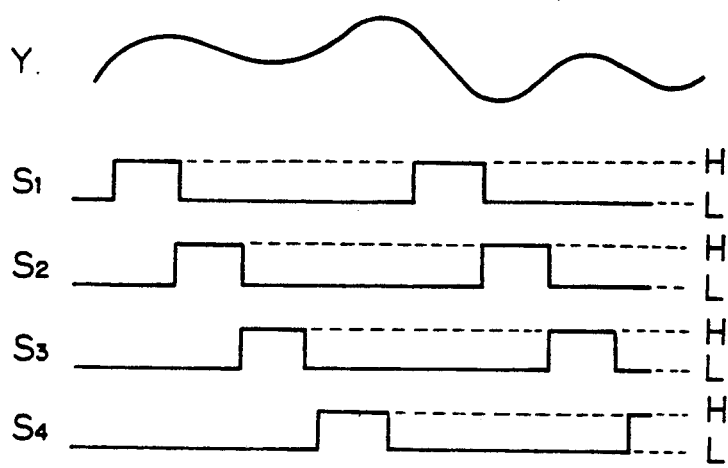
FIG. 4 shows a timing chart regarding the operation of the analog signal storage circuit shown in FIG. 3.

The operation of the analog signal storage circuit shown in FIG. 3 will be explained. Analog switch control signals $S_1$ to $S_3$ are in turn turned to a high level, as shown in FIG. 4.

Each of the analog switches 27 to 29 is turned on while the analog switch control signals $S_1$ to $S_3$ are at a high level, with the result that an analog signal (for instance, a video signal) Y inputted via the signal input line 42 is sampled and stored in the capacitors 33 to 35, respectively.

After analog signals are stored in the capacitors 33 to 35 respectively, the analog switch control signal $S_4$ is turned to a high level and analog switches 30 to 32 are all closed.

As a result, the signals stored in the capacitors 33 to 35 are transferred to and stored in the capacitors 36 to 38 via the analog switches 30 to 32, respectively.

The analog signals stored in the capacitors 36 to 38 are output via buffers 39 to 41, respectively.

If the charges accumulated in the capacitor 33 is denoted by Q at a time when the analog switch 27 is closed and the capacitance of the capacitor 33 is denoted by $C_1$, then the potential $V_1$ of the terminal of the capacitor 33 connected to the analog switch 27 is expressed as $$V_1 = Q/C_1 \qquad (2)$$

When the analog switch 30 is closed, the charge Q is distributed to the capacitors 33 and 36 respectively. Hence, if the capacitance of the capacitor 36 is denoted by $C_4$, the potential $V_2$ of the terminal of the capacitor 36 connected to the analog switch 30 is expressed as $$V_2 = Q/(C_1 + C_4) \qquad (3)$$

The potential $V_2$ should preferably be equal to the potential $V_1$. However, because of the presence of the capacitance $C_4$, the potentials $V_1$ and $V_2$ have a relation of $V_2 < V_1$.

In a case that the capacitor shown in FIG. 2 is used as the capacitor 36 in the analog signal storage circuit in FIG. 3, the first metallic layer 21 is connected to the analog switch 30 and the diffusion layer 19 is provided with the ground potential via the metallic layer 26. The second metallic layer 23 is provided with a proper potential.

Many widely different embodiments of the present invention can be made without departing from the spirit and scope thereof, therefore, it is to be understood that this invention is not limited to the specific embodiments thereof except as defined in the appended claims.

What is claimed is:

1. A capacitor having a semiconductor substrate with a diffusion layer disposed in a portion of the semiconductor substrate and a first insulation layer disposed on said semiconductor substrate and on the diffusion layer, said capacitor being capable of providing a stable capacitance for an integrated circuit, said capacitor comprising:

a first metallic layer disposed on said diffusion layer for conducting an electric current therethrough with said first insulation layer filled into a space formed between said first metallic layer and said semiconductor substrate;

a second insulation layer disposed on said first metallic layer for insulating said first metallic layer;

a second metallic layer disposed on said second insulation layer for conducting an electric current therethrough;

a third insulation layer disposed on said second metallic layer for protecting said integrated circuit;

a mold resin disposed on said third insulation layer for sealing said capacitor; and a third metallic layer for providing an electric potential to said capacitor therethrough, said third metallic layer being so disposed that both said first metallic layer and said second metallic layer are isolated therefrom.

2. A capacitor according to claim 1, wherein said capacitor has a capacitance C expressed by the relation $C = C_M + C_B$ where $C_M$ represents the capacitance between sad first metallic layer and said second metallic layer and $C_B$ represents the capacitance between said first metallic layer and said semiconductor substrate.

3. A capacitor according to calim 2, wherein said capacitor is connected to an analog signal storage circuit.

4. A capacitor according to claim 3, wherein said capacitor is connected to store an analog signal.

5. A capacitor according to claim 4, wherein said analog signal is a video signal.

* * * * *